(12) United States Patent
Shin et al.

(10) Patent No.: US 6,251,241 B1
(45) Date of Patent: Jun. 26, 2001

(54) INDUCTIVE-COUPLED PLASMA APPARATUS EMPLOYING SHIELD AND METHOD FOR MANUFACTURING THE SHIELD

(75) Inventors: Eun-Hee Shin; Jin-Man Kim, both of Seoul; Baik-Soon Choi; Hun Cha, both of Kyunggi-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/546,557

(22) Filed: Apr. 10, 2000

(30) Foreign Application Priority Data

Apr. 9, 1999 (KR) .................................................. 99-12530

(51) Int. Cl.$^7$ .................................................. C23C 14/34
(52) U.S. Cl. ............................... 204/298.11; 204/298.06; 204/298.34; 156/345; 118/723 I
(58) Field of Search ......................... 204/298.11, 298.06, 204/298.34; 156/345, 345 C; 118/723 I (56) References Cited

U.S. PATENT DOCUMENTS 5,234,529 * 8/1993 Johnson ................................ 156/345
5,800,688 * 9/1998 Lantsman et al. ............. 204/298.11

FOREIGN PATENT DOCUMENTS

607797 * 7/1994 (EP) ............................... H01J/37/32

* cited by examiner

Primary Examiner—Nam Nguyen
Assistant Examiner—Steven H. VerSteeg
(74) Attorney, Agent, or Firm—Jones Volentine, L.L.C.

(57) ABSTRACT

An inductive-coupled plasma apparatus employs a shield to reduce sputter contamination. A method for manufacturing the shield is included. An apparatus for generating a high-density plasma includes a process chamber having a dielectric window located along a plane, a coil located outside the process chamber proximate to the dielectric window and substantially parallel to the plane, and a shield located between the coil and the dielectric window. The shield has multiple openings, wherein the multiple openings of the shield are disposed at locations corresponding to areas between the turns of the coil.

19 Claims, 8 Drawing Sheets

(Prior Art)

INDUCTIVE-COUPLED PLASMA APPARATUS EMPLOYING SHIELD AND METHOD FOR MANUFACTURING THE SHIELD

CROSS-REFERENCES TO RELATED APPLICATIONS

The present application claims priority under 35 U.S.C. §119 to Korean Patent Application No. 99-12530 filed on Apr. 9, 1999, the entire contents of which are hereby incorporated by reference for all purposes.

BACKGROUND OF THE INVENTION

1. Field of the Invention

The present invention relates to the field of semiconductor device manufacturing and, more particularly to an inductive-coupled plasma apparatus employing a capacitive shield to reduce sputter contamination and a method for manufacturing the shield.

2. Description of the Background Art

The uniform and rapid processing of materials using induction generated, plasma-based processes (also referred to as inductive-coupled plasma processes) is important in the fields of semiconductor device manufacturing, packaging, optics, and the like. Many plasma processes are extensively used for the depositing or reactive etching of layers during semiconductor device fabrication. Especially, a radio frequency (RF at about 13.56 MHz) induction plasma source is known to produce high electron density plasma, thus providing high processing rates.

For example, a semiconductor substrate is disposed within an evacuated chamber coupled to a source of plasma. By appropriately biasing the substrate, the plasma is coupled to the substrate for ion bombarding the substrate, for etching patterns in the substrate, or for depositing ions on the substrate to grow layers of selected materials thereon.

Figure 1:
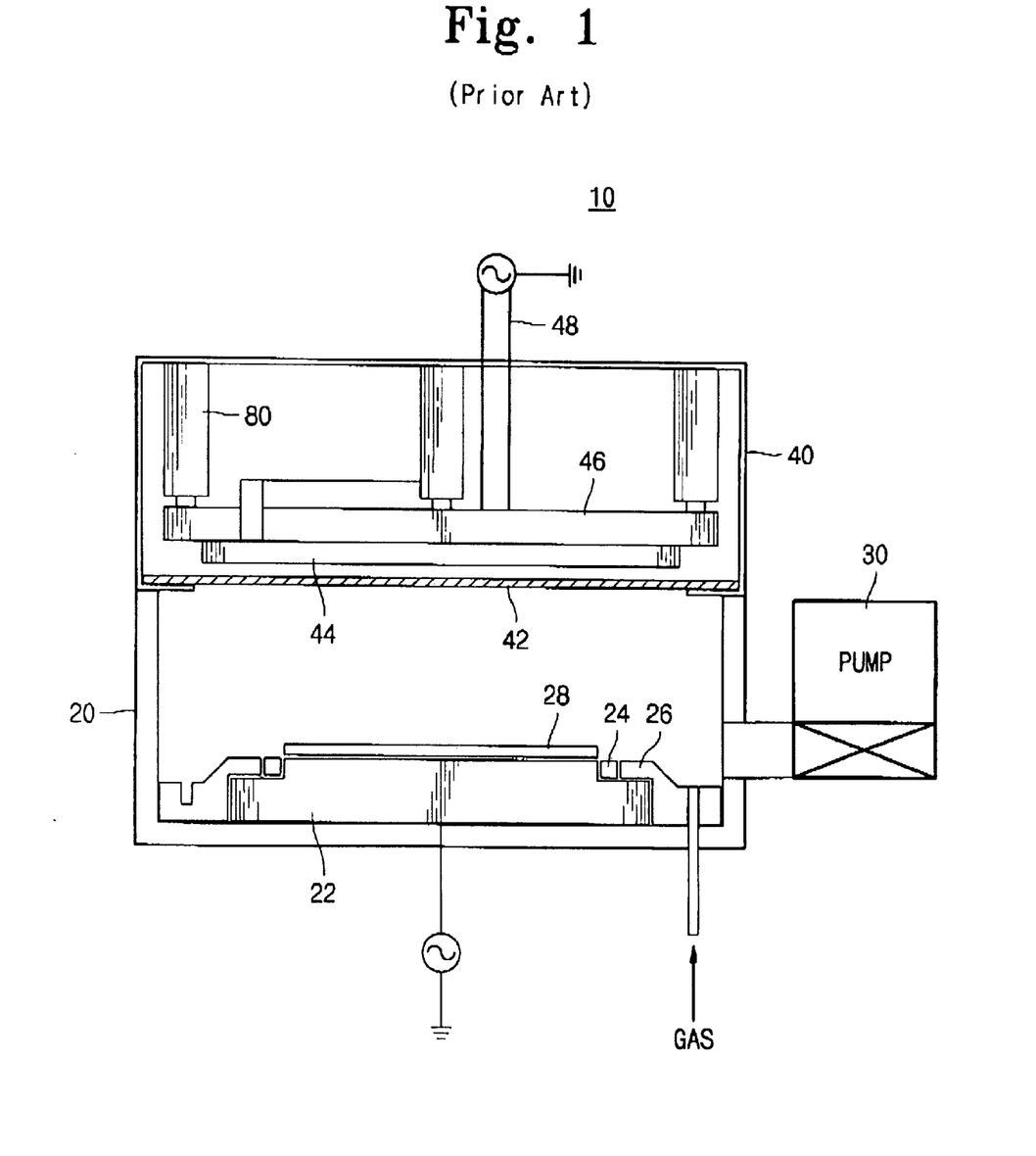
FIG. 1 is a sectional view showing a conventional inductive-coupled plasma apparatus for etching.
Figure 2:
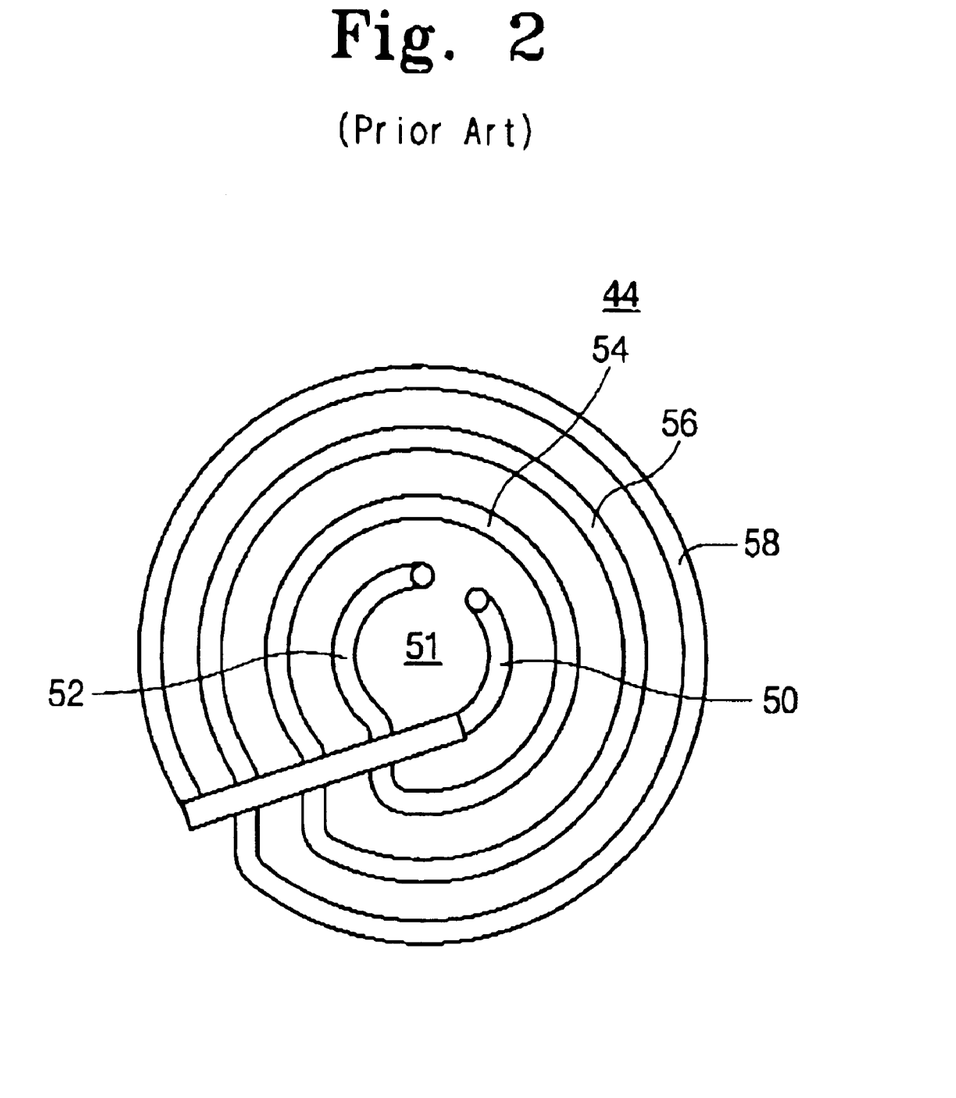
FIG. 2 is a plane view showing a spiral coil of the inductive-coupled plasma apparatus shown in FIG. 1.

Hereinafter a conventional inductive-coupled plasma apparatus 10 shown in FIG. 1 and FIG. 2 is explained in detail. The conventional inductive-coupled plasma apparatus includes a process chamber 20 and a RF housing 40 which is often called a match box. The process chamber 20 includes a supporter 22 for supporting at least one semiconductor wafer 28, an edge ring 24 surrounding the supporter 22 and a gas injection ring 26 for injecting gas into the process chamber 20. Also the process chamber 20 further includes a pump 30 for controlling a pressure of an inner space of the process chamber 20.

A spiral coil 44 shown in FIG. 2 is coupled to the RF housing 40. Power is supplied from RF power supply line 48 to the spiral coil 44. The spiral coil 44 is supported by a coil holder 46, which is fixed to the RF housing 40 through a rod 80. The spiral coil 44 is separated from the plasma by a planar dielectric window 42.

However, in this conventional apparatus, high potentials on the coil cause some degree of capacitive coupling. Therefore, some particular regions, especially regions located underneath the coil on the surface of the planar dielectric window, are etched more excessively than other regions. Thus the etching process is contaminated due to falling particles from the etched regions of the planar dielectric window.

A technique is thus desired for maintaining high inductive coupling between the coil and the plasma, so that improved processing rates and reduction of sputtered contaminates from the dielectric window may be realized.

SUMMARY OF THE INVENTION

The present invention is therefore directed to an inductive coupled plasma apparatus which substantially overcomes one or more of the problems due to the limitations and disadvantages of the related art.

It is therefore an object of the present invention to provide an apparatus for maintaining high inductive coupling and reducing sputtered contaminates from the dielectric window.

The present invention is directed to an apparatus for enhanced inductive coupling to plasma with reduced sputter contamination. The present invention eliminates sputtering of the dielectric window generated by high potentials on the adjacent spiral like or helical coil by adding a shield between the dielectric window and the coil.

The shields of the present invention are designed so that they do not interfere with the inductive coupling of the coil to the plasma, but interfere with the capacitive electric fields generated by the coil.

A primary advantage of the shield of the present invention is the reduction or elimination of sputtered contaminants from the dielectric vacuum window.

In order to attain the above objects, according to an aspect of the present invention, there is provided an apparatus for generating a high-density plasma, which includes a process chamber having a dielectric window located along a plane, a coil located outside the process chamber proximate the dielectric window and substantially parallel to the plane and a capacitive shield located between the coil and the dielectric window, wherein the shield has multiple openings, and wherein the multiple openings of the shield are disposed at locations corresponding to areas between the coil.

In the apparatus according to the invention, the coil may be spiral-shaped and the dielectric window and the shield may be substantially flat, and each of the multiple openings of the shield may be concentric-shaped.

Furthermore, the shield may further include a portion extending outwardly and the apparatus may further include a shield holder for supporting the shield by coupling the portion extending outwardly.

Still further, in the apparatus, the coil may be helical-shaped, the dielectric window and the shield may be disposed concentrically within the coil, and the shield may have a number of helically extending and circumferentially spaced openings.

Still further, in the apparatus, the shield may be made of an aluminum metal or a copper metal, and a surface of the shield may be coated with a silver.

According to another aspect of this invention, there is provided a method of manufacturing a shield of an apparatus for generating a high-density plasma using a coil and having a dielectric window, the method including carrying out an etching process using the plasma, examining a characteristic pattern of etched portions of the surface of the dielectric window, designating first portions to be etched and second portions to be deposited, manufacturing the shield having a first portion corresponding to first portions of the dielectric window and a second portion to be opened corresponding to second portions of the dielectric window, and disposing the second portion of the shield at locations corresponding to areas between the coil.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, which are given by way of illustration only and thus are not limitative of the present invention, and in which like reference symbols indicate the same or similar components, wherein.

DETAILED DESCRIPTION OF THE PREFERRED EMBODIMENTS

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

With reference to FIG. 3 through FIG. 8, one preferred embodiment of a inductive-coupled plasma apparatus according to the invention is described.

Figure 3:
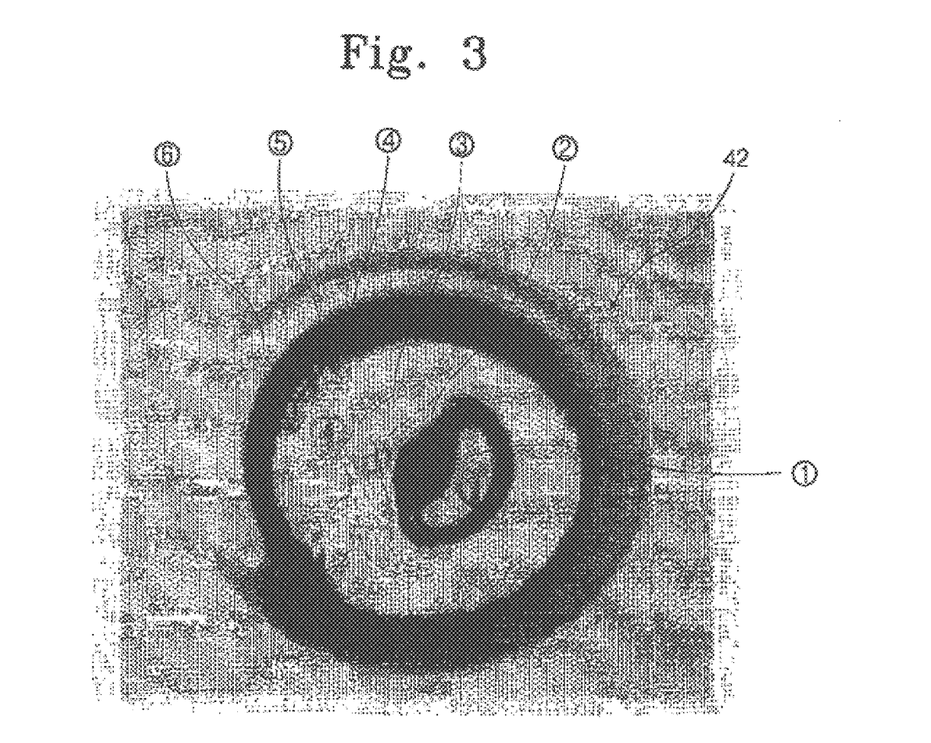
FIG. 3 is a view showing a surface of a dielectric window of the inductive-coupled plasma apparatus shown in FIG. 1 after an etching process.
Figure 4:
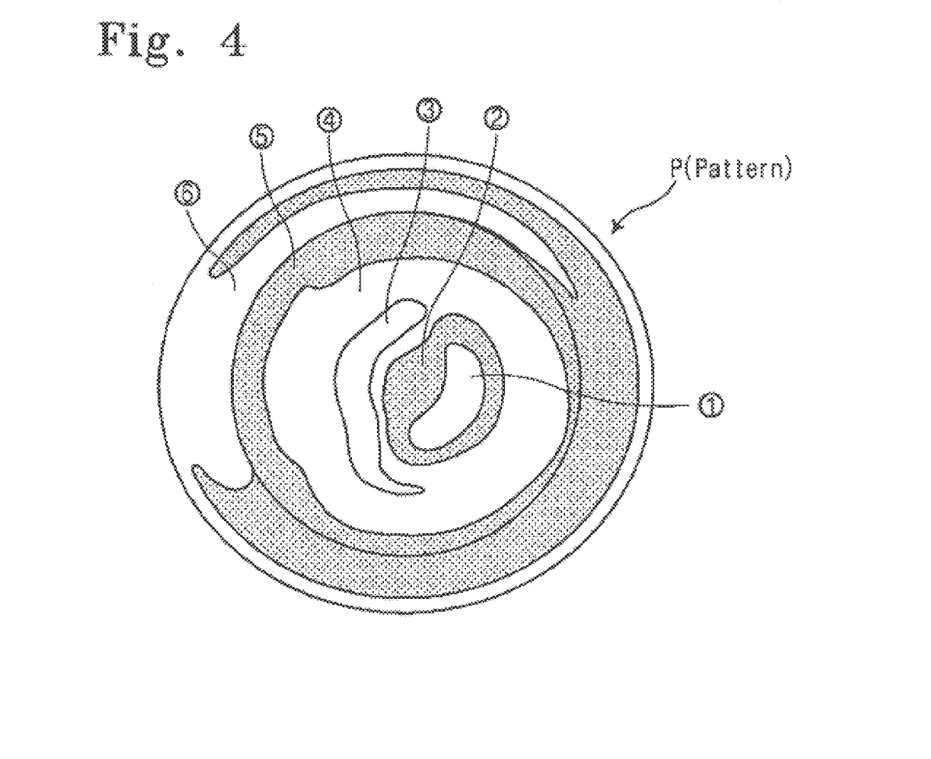
FIG. 4 is a diagram showing patterns copied from a characteristic of the surface of the dielectric window shown in FIG. 3.

A characteristic etching pattern shown in FIG. 3 and FIG. 4 indicates the fact that the etched portions of the surface of the dielectric window coincide with a configuration of the spiral coil. To explain the above mentioned fact in detail according to FIG. 4, portions indicated by numerals 1, 3, 4 and 6 are etched portions and portions indicated by numerals 2 and 5 are portions deposited with particles. According to the etched pattern, the etched portions are all disposed underneath the coil.

The high potentials on the coil cause some degree of capacitive coupling, particularly in the vertical direction of the coil (or in an orthogonal direction between the coil and the dielectric window). This capacitive coupling collects ions, which results in etching at the particular regions of the dielectric window disposed underneath the coil. Therefore, some particular regions of the dielectric window disposed underneath the coil are etched more excessively than other regions.

Figure 6:
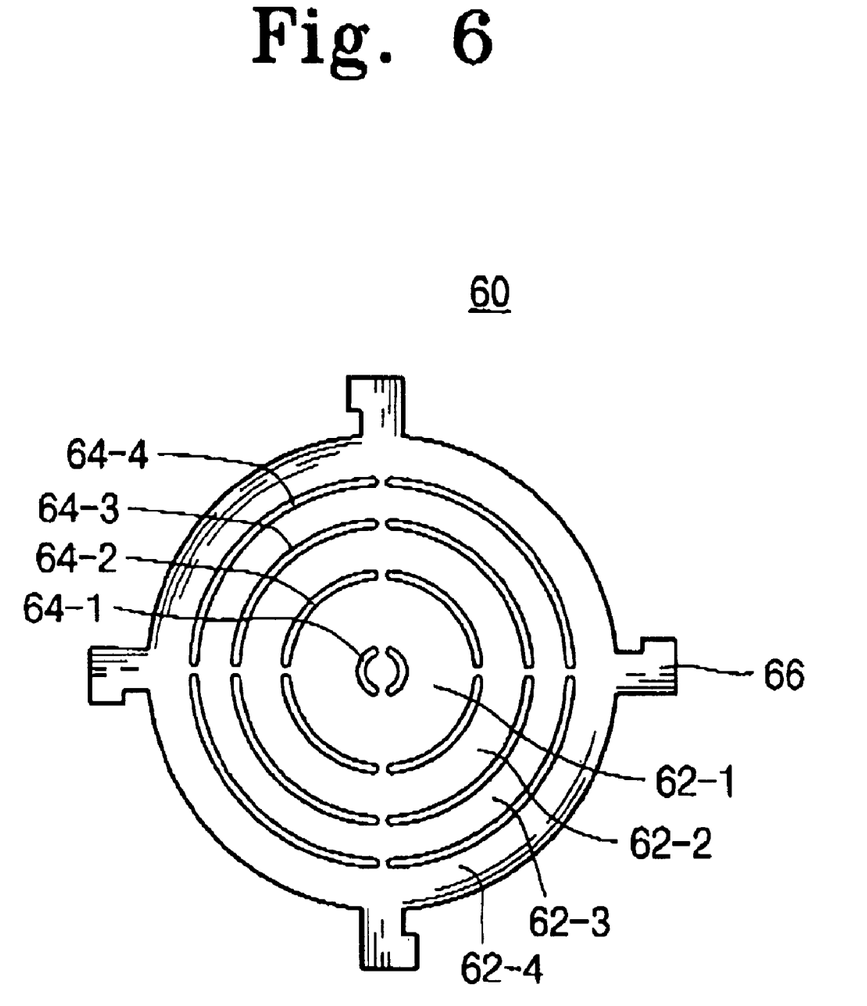
FIG. 6 is a plane view showing a shield according to a preferred embodiment of the present invention.

Therefore, the shield of a preferred embodiment of the present invention as illustrated in FIG. 6 includes two regions. The first regions indicated by 62-1, 62-2, 62-3 and 62-4 corresponding to the coil are not opened and the second regions 64-1, 64-2, 64-3 and 64-4 corresponding to areas disposed between the turns of coil are open. The first regions 62-1, 62-2, 62-3 and 62-4 are disposed underneath the coil and are added between the coil and the dielectric window to protect the surface of the dielectric window against capacitive coupling in the vertical direction. The second regions 64-1, 64-2, 64-3 and 64-4 are disposed at locations corresponding to areas between the turns of the coil and are arcuate-split or concentric split shaped.

Figure 5:
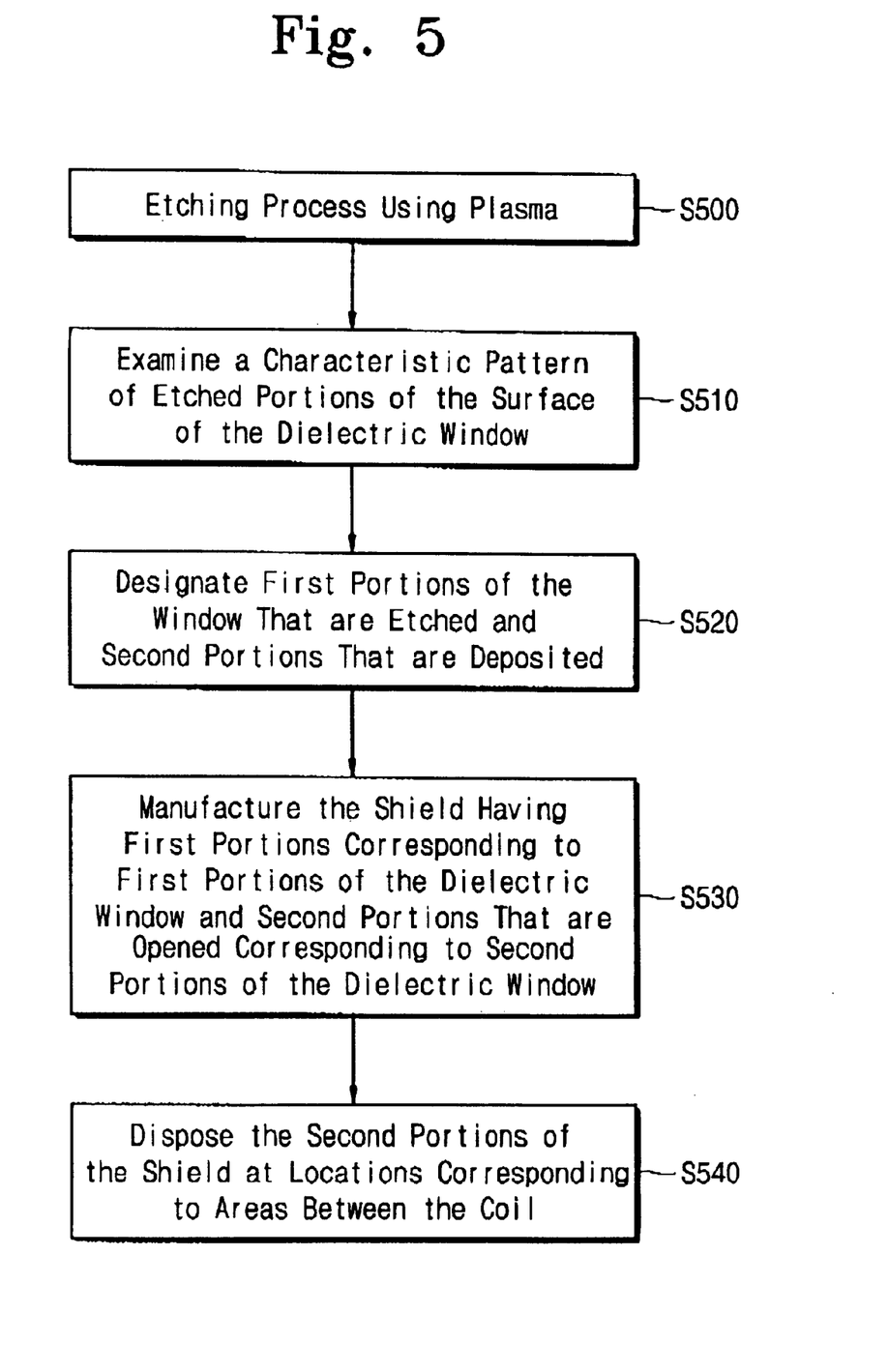
FIG. 5 is a flowchart showing a method of manufacturing a shield of the present invention.

In the present invention, the shield is manufactured by the following steps according to FIG. 5. At first step S500, the etching process is carried out using the plasma, and in the next step S510, a characteristic pattern of etched portions on the surface of the dielectric window is examined. In the next step S520, first portions of the dielectric window that are etched and second portions that are deposited are designated, and in the next step S530, the shield having a first portion corresponding to the first portions of the dielectric window and a second portion to be opened corresponding to the second portions of the dielectric window is manufactured. And in final step S540, the shield is disposed so that the second portion is disposed at locations corresponding to areas between the coils.

However, it is to be understood that the shape of the slits of the shield according to the present invention is not limited to the disclosed preferred embodiments. On the contrary, it is intended to cover various modifications and similar arrangements.

Figure 7:
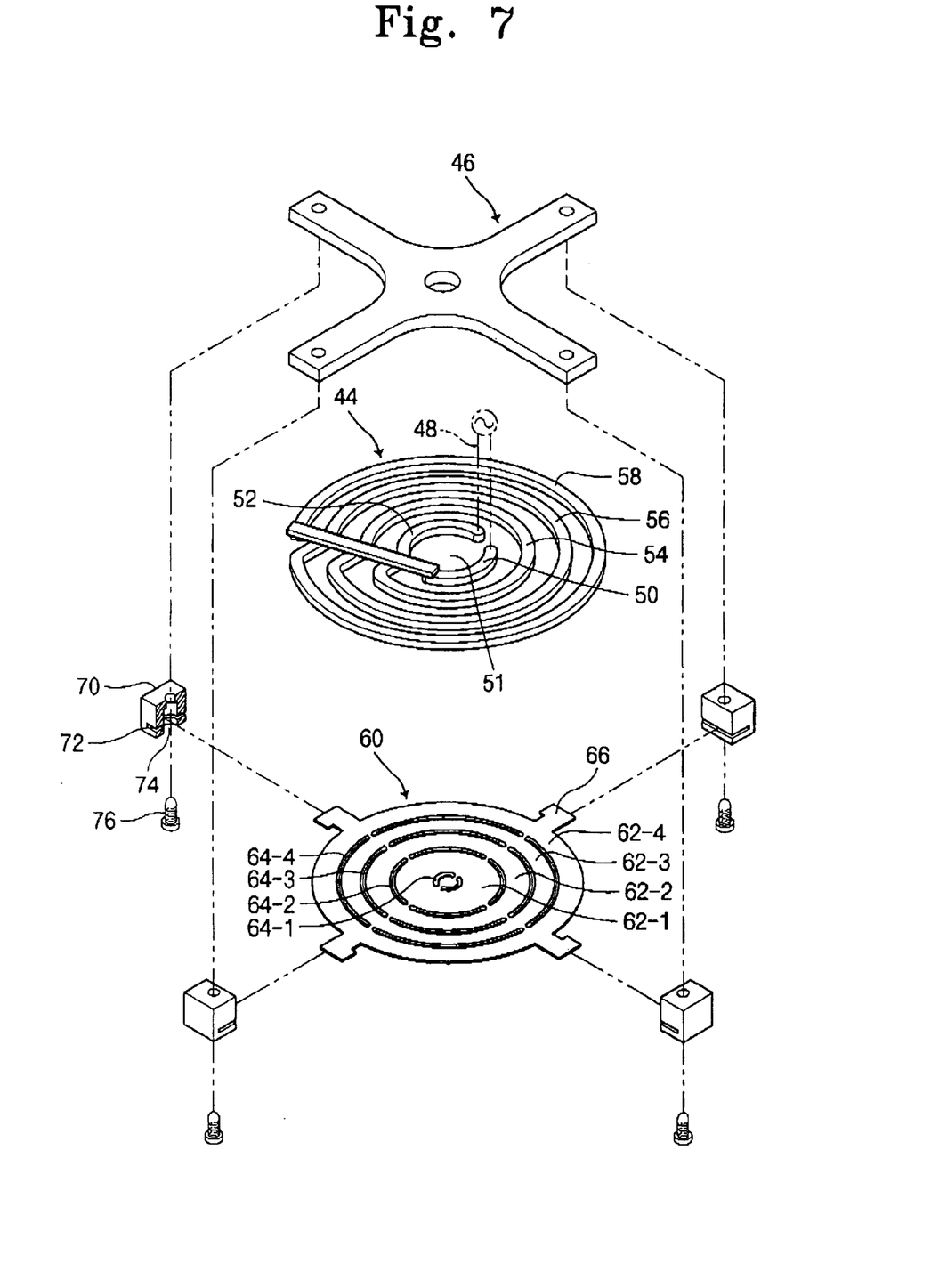
FIG. 7 is an exploded perspective view showing a coil unit of an inductive-coupled plasma apparatus according to a preferred embodiment of the present invention.
Figure 8:
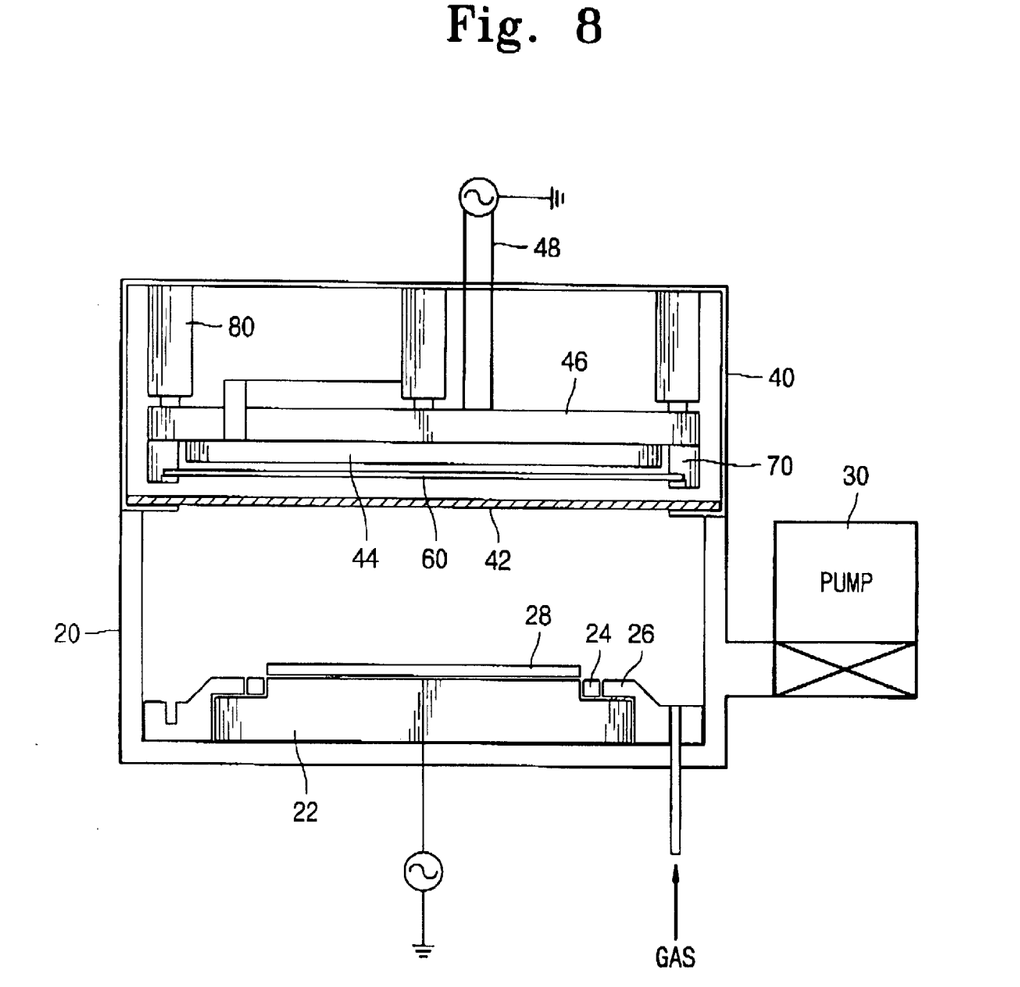
FIG. 8 is a sectional view showing an inductive-coupled plasma apparatus including the shield according to a preferred embodiment of the present invention.
Figure 9:
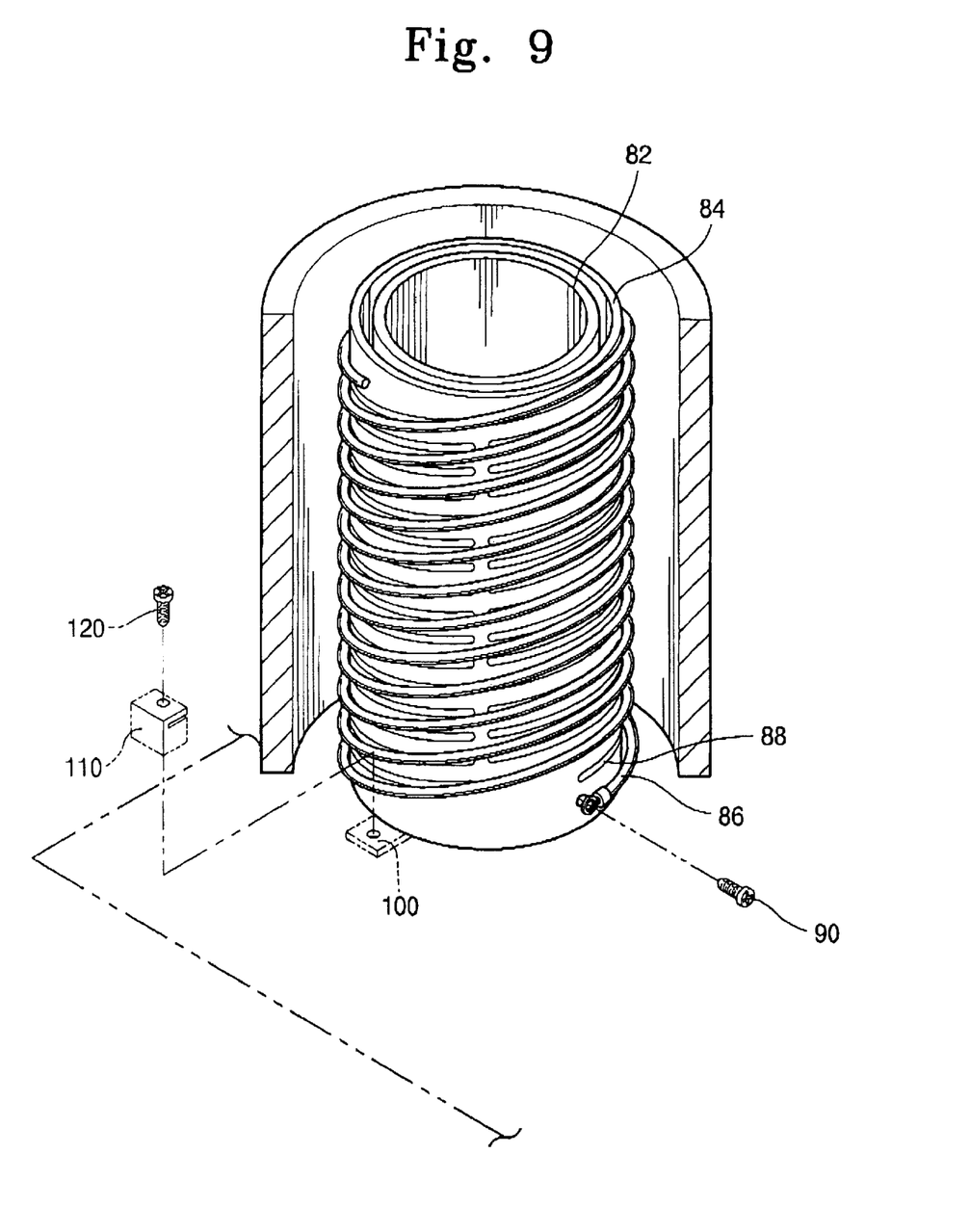
FIG. 9 is an exploded perspective view showing a shield used in a helical coil according to another preferred embodiment of the present invention.

With reference to FIGS. 7–9, shields of preferred embodiments of the present invention are described.

Shield 60 of a preferred embodiment of the present invention is added between the coil 44 and the dielectric window 42 shown in FIG. 8. The coil 44 is supplied with power by RF power supply source 48. A coil holder 46 holds the coil 44.

The shield 60 is fixed to at least one shield holder 70. The shield holder 70 includes a slit 72 to contain an extending portion 66 of the shield 60 and a screw hole 74 for coupling a screw 76.

In a preferred embodiment of the present invention, as most clearly seen in FIG. 7, a central portion 51 of coil 44 is open. A first portion 50, 52 of the coil 44 is disposed corresponding to a first cover portion 62-1 of the shield 60, a second portion 54 is disposed corresponding to a second cover portion 62-2 of the shield 60, a third portion 56 of the coil 44 is located corresponding to a third cover portion 62-3 and a fourth portion 58 of the coil 44 is located corresponding to a fourth cover portion 62-4.

As described above, portions of the shield 60 corresponding to locations underneath the coil are portions having no hole or slit, but portions of the shield corresponding to locations underneath gaps between the turns of coils are portions that are opened, or for example having slits or holes. Portions having no hole protect the dielectric window against capacitive coupling. Thus, particular portions of the dielectric window corresponding to locations underneath the coil are not excessively etched.

Referring to FIG. 8, an inductive-coupled plasma apparatus including a shield having multiple slits is illustrated.

The shield 60 is added between the coil 44 supported by the coil holder 46 and the dielectric window 42. The shield 60 is supported by the shield holder 70. In the slit 72 of the shield holder 70, the extending portion 66 of the shield 60 is inserted.

A shield according to another preferred embodiment of the present invention is illustrated in FIG. 9. The apparatus shown in FIG. 9 includes a helical coil 86, a shield 84 disposed concentrically within the coil 86, and an internal tube 82 of a low loss dielectric insulating material, e.g., of quartz.

A lower end of the coil 86 is electrically connected to the shield 84 by a screw 90. The shield 84 can be mounted on the internal tube 82 or coupled to the inner wall of a process chamber by a coupling mechanism. The coupling mechanism includes a support member 110 and an extending member 100 of the shield 84. The support member 110 may be coupled to an extending member 100 with a screw 120. The support member 110 can be connected with the process chamber.

The shield 84 is provided with a number of helically extending and circumferentially spaced slits 88. The shape of the slits 88 correspond to the shape of the helical coil 86.

In the present invention, the shield may be made of an aluminum metal, or a copper metal which has a good conductive property. Also, the surface of the shield can be coated with a silver, which increases conductivity and prevents corrosion.

In a preferred embodiment of the present invention, the thickness of the shield may preferably be between 0.5 mm and 2.0 mm.

According to a shield of the present invention, it is possible to prevent etching on the surface of the dielectric window at locations corresponding to areas underneath coils. This prevention reduces contamination of the semiconductor wafer and improves the yield of the semiconductor process.

Further, it is possible to prolong the average span of the dielectric window, which results in production cost savings.

The invention has been described using exemplary embodiments. However, it is to be understood that the scope of the invention is not limited to the disclosed preferred embodiments. On the contrary, it is intended to cover various modifications and similar arrangements. Such modifications are not to be regarded as a departure from the spirit and scope of the invention, and all such modifications as would be obvious to one skilled in the art are intended to be included within the scope of the following claims.

What is claimed is:

1. An apparatus for generating a high-density plasma, comprising:
   a process chamber having a dielectric window located along a plane;
   a coil having a plurality of turns located outside the process chamber proximate to the dielectric window and substantially parallel to the plane; and
   a capacitive shield located between the coil and the dielectric window, wherein the shield has multiple openings disposed at locations corresponding to areas between adjacent turns of the plurality of turns of the coil.

2. The apparatus of claim 1, wherein the coil is spiral-shaped.

3. The apparatus of claim 1, wherein the dielectric window and the shield are substantially flat.

4. The apparatus of claim 3, wherein each of the multiple openings of the shield are concentric-shaped.

5. The apparatus of claim 3, wherein the shield further comprises a shield portion extending outwardly,
   the apparatus further including a shield holder coupled to the shield portion extending outwardly, the shield holder supporting the shield.

6. The apparatus of claim 1, wherein the coil is helical-shaped.

7. The apparatus of claim 1, wherein the dielectric window and the shield are disposed concentrically within the coil.

8. The apparatus of claim 7, wherein the shield has a number of helically extending and circumferentially spaced openings.

9. The apparatus of claim 1, wherein the shield is made of aluminum.

10. The apparatus of claim 1, wherein the shield is made of copper.

11. The apparatus in claim 1, wherein a surface of the shield is coated with silver.

12. A plasma generator comprising:
    a coil having a plurality of turns generating radiation;
    a dielectric window through which the radiation is passed; and
    a capacitive shield disposed between said coil and said dielectric window, the capacitive shield having multiple openings and shielding portions,
    the shielding portions being disposed on the capacitive shield at areas corresponding to the coil to prevent capacitive coupling in an orthogonal direction between the coil and the dielectric window.

13. The plasma generator of claim 12, wherein the coil is spiral shaped and the multiple openings are disposed at locations on the shield that correspond to areas between adjacent turns of the plurality of turns of the coil.

14. The plasma generator of claim 12, wherein the dielectric window and the shield are substantially flat.

15. The plasma generator of claim 12, wherein the coil is helical-shaped and the multiple openings are disposed at locations on the shield that correspond to areas between adjacent turns of the plurality of turns of the coil.

16. The plasma generator of claim 12, wherein the dielectric window and the shield are disposed concentrically within the coil.

17. The plasma generator of claim 12, wherein the shield comprises aluminum.

18. The plasma generator of claim 12, wherein the shield comprises copper.

19. The plasma generator of claim 12, wherein a surface of the shield is coated with silver.

* * * * *